(12) United States Patent
Ok et al.

(10) Patent No.: US 10,763,431 B2
(45) Date of Patent: Sep. 1, 2020

(54) FILM STRESS CONTROL FOR MEMORY DEVICE STACK

(71) Applicant: International Business Machines Corporation, Armonk, NY (US)

(72) Inventors: Injo Ok, Loudonville, NY (US); Choonghyun Lee, Rensselaer, NY (US); Chih-Chao Yang, Glenmont, NY (US); Seyoung Kim, Westchester, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

(21) Appl. No.: 16/193,851

(22) Filed: Nov. 16, 2018

(65) Prior Publication Data
US 2020/0161547 A1    May 21, 2020

(51) Int. Cl.
| | | |
|---|---|---|
| H01L 49/02 | (2006.01) | |
| H01L 45/00 | (2006.01) | |
| H01L 43/02 | (2006.01) | |
| H01L 27/24 | (2006.01) | |
| H01L 43/12 | (2006.01) | |
| H01L 27/11502 | (2017.01) | |
| H01L 27/22 | (2006.01) | |

(52) U.S. Cl.
CPC .......... *H01L 45/1253* (2013.01); *H01L 28/75* (2013.01); *H01L 43/02* (2013.01); *H01L 27/11502* (2013.01); *H01L 27/222* (2013.01); *H01L 27/2463* (2013.01); *H01L 28/55* (2013.01); *H01L 43/12* (2013.01); *H01L 45/1675* (2013.01)

(58) Field of Classification Search
CPC ...... H01L 28/75; H01L 45/1253; H01L 43/02
USPC ............................................................ 257/4
See application file for complete search history.

(56) References Cited

U.S. PATENT DOCUMENTS

| | | | |
|---|---|---|---|
| 6,238,964 B1 * | 5/2001 | Cho | ........................ H01L 28/75 257/E21.009 |
| 7,282,755 B2 | 10/2007 | Pakala et al. | |
| 8,310,861 B2 | 11/2012 | Liu et al. | |
| 8,426,967 B2 * | 4/2013 | Joseph | ................ H01L 27/2436 257/758 |
| 8,487,390 B2 | 7/2013 | Dimitrov et al. | |
| 9,000,545 B2 | 4/2015 | Kajiyama | |
| 9,030,200 B2 | 5/2015 | Deak | |

(Continued)

FOREIGN PATENT DOCUMENTS

WO    2017171747    10/2017

OTHER PUBLICATIONS

Roschewsky, et al., "Magnetic Tunnel Junction Performance Under Mechanical Strain", Appl. Phys. Lett., Apr. 10, 2018, 4 pages, 112.

(Continued)

*Primary Examiner* — Jami Valentine Miller
(74) *Attorney, Agent, or Firm* — Scully, Scott, Murphy & Presser, P.C.

(57) ABSTRACT

Semiconductor structures are provided that include a memory device buried within interconnect dielectric materials and in which a combination of a compressive metal-containing layer and a tensile metal-containing layer have been used to minimize wafer bow and litho overlay shift as well as a method of forming such semiconductor structures.

17 Claims, 5 Drawing Sheets

(56) References Cited

U.S. PATENT DOCUMENTS

| | | | |
|---|---|---|---|
| 9,548,444 B2 | 1/2017 | Sandhu et al. | |
| 2003/0106644 A1* | 6/2003 | Sirkis | H01J 37/32009 |
| | | | 156/345.48 |
| 2011/0084323 A1* | 4/2011 | Summerfelt | H01L 27/11507 |
| | | | 257/295 |
| 2012/0001148 A1* | 1/2012 | Miller | H01L 27/2409 |
| | | | 257/4 |
| 2013/0062714 A1 | 3/2013 | Zhu et al. | |
| 2013/0334630 A1 | 12/2013 | Kula et al. | |
| 2016/0141294 A1* | 5/2016 | Peri | H01L 21/28512 |
| | | | 257/324 |
| 2017/0184221 A1* | 6/2017 | McNamara | F16K 99/0042 |
| 2017/0229577 A1* | 8/2017 | Matsuura | H01L 27/11582 |
| 2017/0263634 A1* | 9/2017 | Inokuma | H01L 27/11565 |
| 2017/0330697 A1* | 11/2017 | McNamara | H01G 5/011 |
| 2018/0076215 A1* | 3/2018 | Nishimura | H01L 23/5283 |

OTHER PUBLICATIONS

Nam, B.-W., et al., "Investigation of Wafer Warpage Induced by Multi-layer Films", Journal of Semiconductor Technology and Science, Feb. 2018, 7 pages, vol. 18, No. 1.

\* cited by examiner

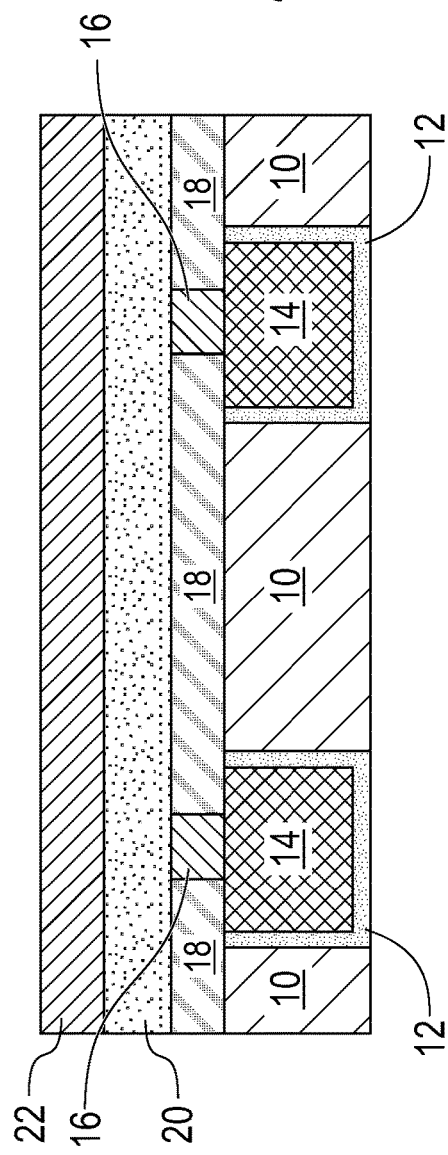
FIG. 1A
FIG. 1B
Wafer bow
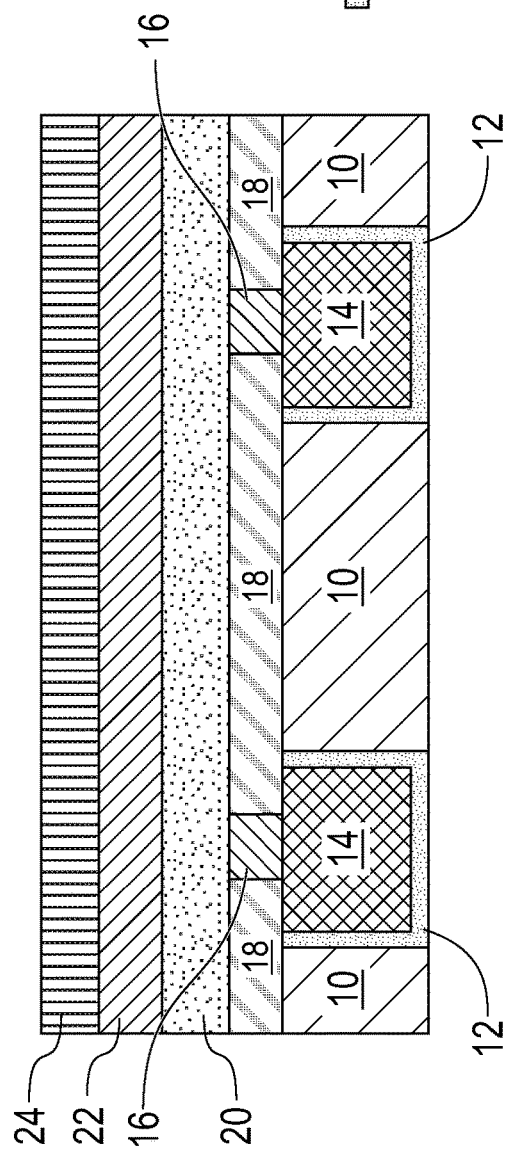
FIG. 2A
FIG. 2B
No wafer bow

FILM STRESS CONTROL FOR MEMORY DEVICE STACK

BACKGROUND

The present application relates to a semiconductor structure and a method of forming the same. More particularly, the present application relates to semiconductor structures including a memory device in which a combination of a compressive metal-containing layer and a tensile metal-containing layer have been used to minimize wafer bow and litho overlay shift as well as a method of forming such semiconductor structures.

Memory device stacks which are used in fabricating a non-volatile random access memory device require bottom and top electrode layers composed of a thick conducting metal. Typically, transition metals with nitrogen are used as the conducting metal that provides the top electrode layer and the bottom electrode layer of the memory device stack. Tantalum nitride deposited by physical vapor deposition (PVD) often generates compressive stress which may cause buckling defects (i.e., wafer bowing) and litho overlay issues. Titanium nitride, which may provide a tensile stress, a compressive stress, or a neutral stress depending on the content of nitrogen in the titanium nitride itself, has a film morphology that is typically columnar when deposited by a PVD process. Columnar morphology for an electrode layer is not desirable since it provides a diffusion path source within the memory device.

There is thus a need for providing a memory device in which wafer bowing and litho overlay issues have been minimized.

SUMMARY

Semiconductor structures are provided that include a memory device buried within interconnect dielectric materials and in which a combination of a compressive metal-containing layer and a tensile metal-containing layer have been used to minimize wafer bow and litho overlay shift as well as a method of forming such semiconductor structures.

In one aspect of the present application, a semiconductor structure is provided. In one embodiment, the semiconductor structure includes a bottom electrode located on a surface of a first electrically conductive structure that is embedded in a first interconnect dielectric material layer. A memory device pillar is located on a surface of the bottom electrode, and a top electrode is located on the memory device pillar. In this embodiment, the top electrode includes a compressive metal-containing portion in direct physical contact with the memory device pillar, and a tensile metal-containing portion located on the compressive metal-containing portion. The tensile metal-containing portion compensates the compressive stress caused by the compressive metal-containing portion.

In another embodiment, the semiconductor structure includes a bottom electrode located on a surface of a first electrically conductive structure that is embedded in a first interconnect dielectric material layer. A compressive metal-containing portion is located above the bottom electrode, a memory device pillar is located on a surface of the compressive metal-containing portion, and a top electrode composed of a tensile metal-containing portion is located on the memory device pillar. The tensile metal-containing portion compensates the compressive stress caused by the compressive metal-containing portion.

In another aspect of the present application, a method of reducing wafer bowing in a semiconductor structure is provided. In one embodiment, the method includes forming a bottom electrode located on a surface of a first electrically conductive structure, wherein the first electrically conductive structure is embedded in a first interconnect dielectric material layer. A memory device stack is formed above the bottom electrode and on a topmost surface of the first interconnect dielectric material layer, wherein a compressive metal-containing layer contacts one surface of the memory device stack. A tensile metal-containing layer is formed above the memory device stack, wherein the tensile metal-containing layer compensates the compressive stress caused by the compressive metal-containing layer.

BRIEF DESCRIPTION OF THE DRAWINGS

FIG. 1A is a cross sectional view of an exemplary semiconductor structure that can be employed in the present application and including a bottom electrode embedded in a dielectric capping layer and located on a surface of a first electrically conductive structure, wherein a memory device stack and a compressive metal-containing layer are located above the bottom electrode.

FIG. 1B is a pictorial representation showing the wafer bow that occurs with the exemplary semiconductor structure of FIG. 1A.

FIG. 2A is a cross sectional view of the exemplary semiconductor structure of FIG. 1A after forming a tensile metal-containing layer directly on a physically exposed surface of the compressive metal-containing layer.

FIG. 2B is a pictorial representation showing the elimination of wafer bowing that occurs with the exemplary semiconductor structure of FIG. 2A.

DETAILED DESCRIPTION

Figure 3:
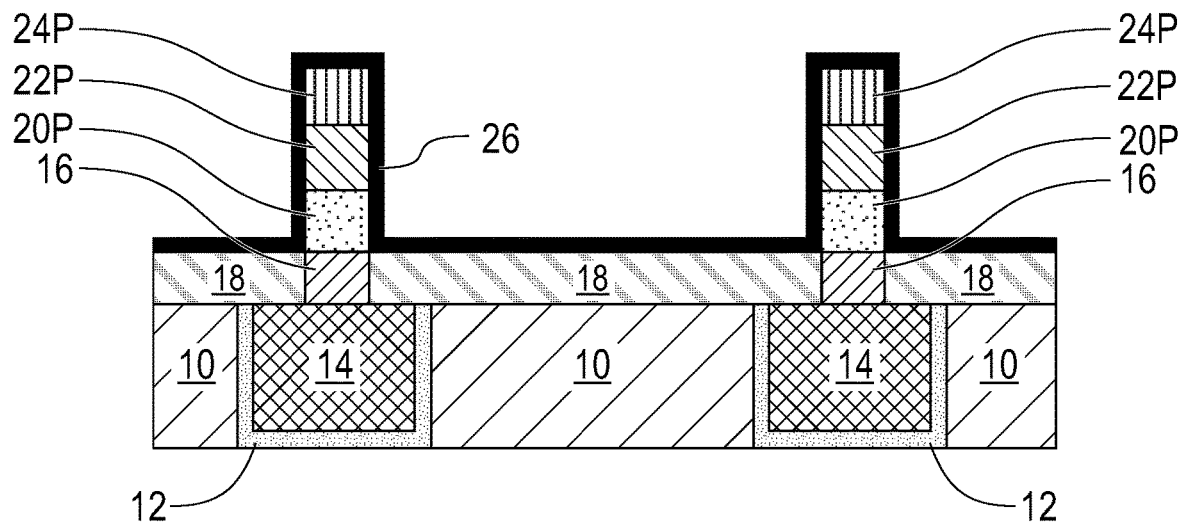
FIG. 3 is a cross sectional view of the exemplary semiconductor structure of FIG. 2A after patterning the tensile metal-containing layer, the compressive metal-containing layer and the memory device stack, and forming a passivation layer on physically exposed surfaces of the patterned tensile metal-containing layer (i.e., tensile metal-containing portion), the compressive metal-containing layer (i.e., compressive metal-containing portion), and the patterned memory device stack (i.e., memory device pillar).

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1A, there is illustrated an exemplary semiconductor structure that can be employed in the present application. The exemplary structure of FIG. 1 includes a bottom electrode 16 embedded in a dielectric capping layer 18 and located on a surface of a first electrically conductive structure 14. The exemplary structure of FIG. 1 further includes a memory device stack 20 and a compressive metal-containing layer 22 located above the bottom electrode 16. As is further shown, the first electrically conductive structure 14 is embedded in a first interconnect dielectric material layer 10, and an optional first diffusion barrier liner 12 is located on the sidewalls and bottom wall of the first electrically conductive structure 14.

It is noted that the drawings of the present application illustrate a memory device area in which a memory device in accordance with the present application will be subsequently formed. A non-memory device area may be located laterally adjacent to the memory device area illustrated in the drawings of the present application. It is further noted that although the present application illustrates a plurality of bottom electrodes 16, and a plurality of first electrically conductive structures 14, the present application contemplates embodiments in which only a single bottom electrode 16 is formed on a single first electrically conductive structure 14 that is embedded in the first interconnect dielectric material layer 10.

The first interconnect dielectric material layer 10 can be composed of any interconnect dielectric material including, for example, silicon dioxide, silsesquioxanes, C doped oxides (i.e., organosilicates) that includes atoms of Si, C, 0 and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first electrically conductive structure 14 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a first diffusion barrier liner 12 is formed along the sidewalls and a bottom wall of the first electrically conductive structure 14. In some embodiments, no diffusion barrier liner is present. The first diffusion barrier liner 12 is composed of a diffusion barrier material (i.e., a material that serves as a barrier to prevent a conductive material such as copper from diffusing there through). Examples of diffusion barrier materials that can be used in providing the first diffusion barrier liner 12 include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the first interconnect dielectric material layer 10, the first electrically conductive structure 14, and, if present, the first diffusion barrier liner 12 may be formed utilizing conventional processes that are well-known to those skilled in the art. So as to not obscure the method of the present application, the techniques used to form the interconnect level including the first interconnect dielectric material layer 10, the first electrically conductive structure 14, and, if present, the first diffusion barrier liner 12 are not provided herein. It is noted that at least one other interconnect level and/or a middle-of-the-line (MOL) level may be located beneath the interconnect level including the first interconnect dielectric material layer 10, the first electrically conductive structure 14, and, if present, the first diffusion barrier liner 12. These other levels are not shown for clarity.

As is shown, the bottom electrode 16 is located on a surface of the first electrically conductive structure 14 that is embedded in the first interconnect dielectric material layer 10. In some embodiments (not shown), the bottom electrode 16 can be located on a recessed surface of the first electrically conductive structure 14. In such an embodiment, and prior to forming the bottom electrode 16, an upper portion of the first electrically conductive structure 14 is removed utilizing a recess etching process, and thereafter the bottom electrode 16 is formed upon the recessed surface of the first electrically conductive structure 14. In other embodiments and as shown in FIG. 1, the bottom electrode 16 is formed on a non-recessed surface of the electrically conductive structure 14. In such an embodiment, a dielectric capping layer 18 is located laterally adjacent to the bottom electrode 16 and on a surface of the first interconnect dielectric material layer 10.

Bottom electrode 16, which is formed on a surface of the first electrically conductive structure 14, may be composed of Cu, Ta, TaN, Ti, TiN, Ru, RuN, RuTa, RuTaN, Co, CoWP, CoN, W, WN or any combination thereof. The bottom electrode 16 may have a thickness from 2 nm to 80 nm; other thicknesses are possible and can be used in the present application as the thickness of the bottom electrode 16. The bottom electrode 16 may be formed by a deposition process such as, for example, sputtering, electroplating, electroless plating, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, photolithography and etching) may follow the deposition of the conductive material that provides the bottom electrode 16.

In some embodiments and as shown in FIG. 1, the bottom electrode 16 has a topmost surface that is coplanar with a topmost surface of a dielectric capping layer 18 that may be present laterally adjacent to the bottom electrode 16 and on a topmost surface of the first interconnect dielectric material layer 10. In other embodiments (not shown), the bottom electrode 16 has a topmost surface that is coplanar with a topmost surface of the first interconnect dielectric material layer 10.

When present, the dielectric capping layer 18 can be formed either prior to, or after, the formation of the bottom electrode 16. The dielectric capping layer 18 can be composed of any dielectric capping material including, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric capping material that provides the dielectric capping layer 18 may be formed utilizing a deposition process such as, for example, CVD, PECVD, ALD, chemical solution deposition or evaporation.

Memory device stack 20 is then formed on the bottom electrode 16 and, if present, the dielectric capping layer 18. The memory device stack 20 can be used to provide a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. Thus, the memory device stack 20 may include a ferroelectric layer which is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y. The ferroelectric layer of the FE memory device can be formed utilizing a deposition process.

A ReRAM device is a random access memory that typically includes a metal oxide that can exhibit a change in electron localization. Thus, the memory device stack 20 may include a metal oxide such as, for example, oxides of nickel, zirconium, hafnium, iron, or copper. The metal oxide which can be used in the memory device stack 20 can be formed utilizing a deposition process.

A MRAM device is a random access memory that includes a magnetic tunnel junction (MTJ) structure. Thus, the memory device stack 20 may include a multilayered magnetic tunnel junction (MTJ) material stack that may include a magnetic reference layer, a tunnel barrier, a magnetic free layer, and a MTJ cap. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the multilayered MTJ material stack is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators. The magnetic free layer of the multilayered MTJ material stack is composed of a magnetic material with a magnetization that can be changed in orientation relative to the magnetization orientation of the reference layer. Exemplary materials for the magnetic free layer include alloys and/or multilayers of cobalt, iron, alloys of cobalt-iron, nickel, alloys of nickel-iron, and alloys of cobalt-iron-boron. The MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides.

The multilayered MTJ material stack that can be used as the memory device stack 20 can be formed by deposition of the various material layers.

A PRAM device is a random access memory that typically includes a phase change memory material that exhibits a change in atomic order (from crystalline to amorphous or vice versa). Thus, the memory device stack 20 may include a phase change memory material. Exemplary phase change materials include, but are not limited to, a chalcogenide glass example, $Ge_2Sb_2Te_5$ or $Ge_2Bi_2Te_6$. The phase change memory material which can be used in the memory device stack 20 can be formed by deposition.

The compressive metal-containing layer 22 includes any metal-containing material with compressive stress and that is electrically conductive. Illustrative examples of compressive metal-containing materials that can be used in the present application include, but are not limited to, tantalum (Ta), tungsten (W), titanium (Ti), tantalum nitride (TaN), tungsten nitride (WN), or titanium nitride (TiN). The compressive metal-containing layer 22 may be formed utilizing a deposition process such as, for example, CVD, PECVD, ALD, PVD or sputtering. The compressive metal-containing layer 22 may have a thickness from 5 nm to 100 nm. Other thicknesses are contemplated and can be used as the thickness of the compressive metal-containing layer 22.

At this point of the present application, the exemplary structure shown in FIG. 1A has a wafer bow issue as is shown in FIG. 1B. Due to wafer bowing, the exemplary structure shown in FIG. 1A may exhibit poor lithography overlay during the subsequent patterning of the memory device stack 20 and the compressive metal-containing layer 22.

Referring now to FIG. 2A, there is illustrated the exemplary semiconductor structure of FIG. 1A after forming a tensile metal-containing layer 24 directly on a physically exposed surface of the compressive metal-containing layer 22. The tensile metal-containing layer 24 includes any metal-containing material with tensile stress and that is electrically conductive. Illustrative examples of tensile metal-containing materials that can be used in the present application include, but are not limited to, titanium nitride (TiN), copper (Cu), tungsten (W), or tungsten nitride (WN). The tensile metal-containing layer 24 may be formed utilizing a deposition process such as, for example, CVD, PECVD, ALD, PVD or sputtering. The tensile metal-containing layer 24 may have a thickness from 5 nm to 100 nm. Other thicknesses are contemplated and can be used as the thickness of the tensile metal-containing layer 24.

The tensile metal-containing layer 24 compensates for the compressive stress that is introduced by the compressive metal-containing layer 22. Thus, wafer bowing is reduced, and, in some embodiments, even eliminated. FIG. 2B is a pictorial representation showing the elimination of wafer bowing that occurs with the exemplary semiconductor structure of FIG. 2A. The structure shown in FIG. 2B has neutral stress that is achieved by utilizing both the compressive metal-containing layer 22 and the tensile metal-containing layer 24.

Referring now to FIG. 3, there is illustrated the exemplary semiconductor structure of FIG. 2A after patterning the tensile metal-containing layer 24, the compressive metal-containing layer 22 and the memory device stack 20, and forming a passivation layer 26 on physically exposed surfaces of the patterned tensile metal-containing layer (i.e., tensile metal-containing portion 24P), the compressive metal-containing layer (i.e., compressive metal-containing portion 22P), and the patterned memory device stack (i.e., memory device pillar 20P). Collectively, and for this embodiment, the tensile metal-containing portion 24P and the compressive metal-containing portion 22P form a dual top electrode of the memory device of the present application.

The patterning used to provide the exemplary structure shown in FIG. 3 may include photolithography and etching. Photolithography includes applying a photoresist (not shown) to a material or material stack that needs to be patterned, exposing the photoresist to a desired pattern of irradiation and developing the exposed photoresist. Etching includes a dry etch process, a wet etching process or any combination thereof. The dry etch process or the wet etch process may include a single etch or multiple etches.

Due to the reduction in wafer bowing afforded by utilizing the tensile metal-containing layer 24 and the compressive metal-containing layer 22, litho overlay is not an issue. That is, the developed photoresist is present directly over the bottom electrode 16 such that the patterned material stack of the memory device pillar 20P, the compressive metal-containing portion 22P, and the tensile metal-containing portion 24P is located entirely upon, and aligned with, the bottom electrode 16.

The passivation layer 26 is composed of a dielectric material. In one embodiment, the passivation layer 26 is composed of silicon nitride. In another embodiment, the passivation layer 26 may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the passivation layer 26 may be composed of an nBLOK dielectric material that contains atoms of silicon, carbon, hydrogen, nitrogen and oxygen. In alternative example, the passivation layer 26 may be composed of a SiBCN dielectric material that contains atoms of silicon, boron, carbon, hydrogen, and nitrogen. The passivation layer 26 can be formed utilizing a deposition process such as, for example, CVD, PECVD, PVD, or ALD. The passivation layer 26 may have a thickness from 10 nm to 200 nm. Other thicknesses are possible and can be employed as the thickness of the passivation layer 26.

Figure 4:
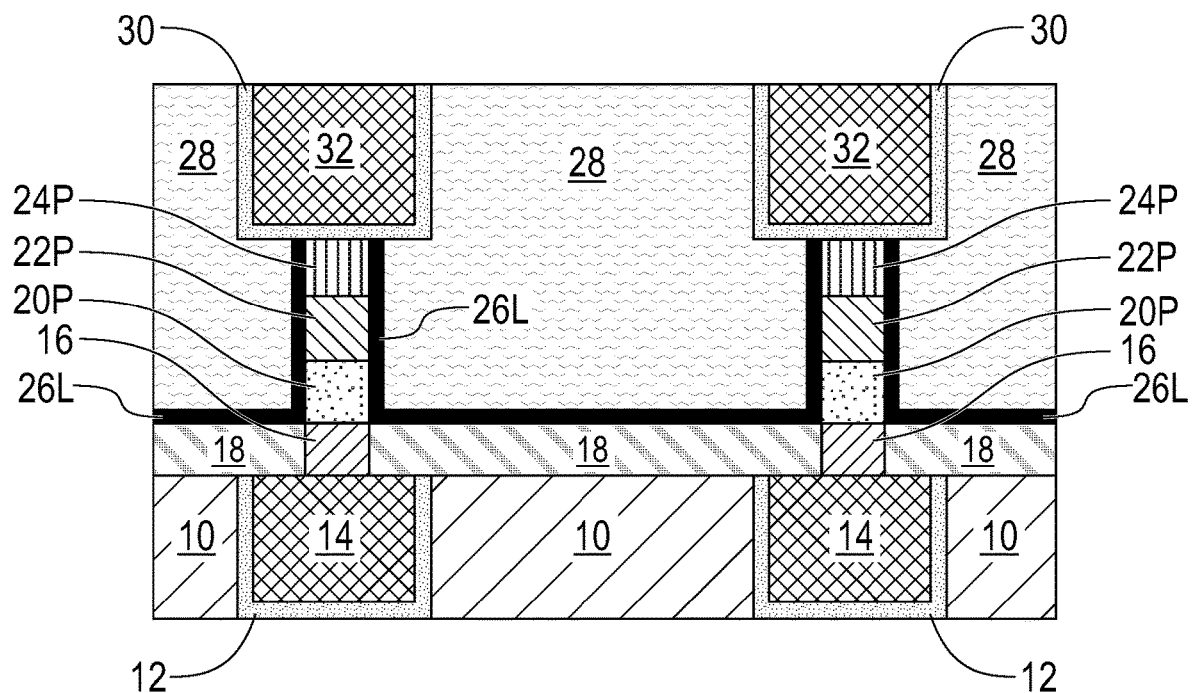
FIG. 4 is a cross sectional view of the exemplary semiconductor structure of FIG. 3 after forming a second interconnect dielectric material layer containing a second electrically conductive structure embedded therein, wherein the second electrically conductive structure contacts a topmost surface of the tensile metal-containing portion.

Referring now to FIG. 4, there is illustrated the exemplary semiconductor structure of FIG. 3 after forming a second interconnect dielectric material layer 28 containing a second electrically conductive structure 32 embedded therein, wherein the second electrically conductive structure 32 contacts a topmost surface of the tensile metal-containing portion 24P.

The second interconnect dielectric material layer 28 is located laterally adjacent to and above the patterned material stack of the memory device pillar 20P, the compressive metal-containing portion 22P, and the tensile metal-containing portion 24P. The second interconnect dielectric material layer 28 may include one of the dielectric materials mentioned above for the first interconnect dielectric material layer 10. In one embodiment, the second interconnect dielectric material layer 28 is composed of a same dielectric material as the first interconnect dielectric material layer 10. In another embodiment, the second interconnect dielectric material layer 28 is composed of a different dielectric material than the first interconnect dielectric material layer 10. The second interconnect dielectric material layer 28 may be formed by utilizing one of the deposition processes mentioned above in forming the first interconnect dielectric material layer 10. The second interconnect dielectric material layer 28 may have a thickness within the thickness range mentioned above for the first interconnect dielectric material layer 10.

An opening is then formed into an upper portion of the second interconnect dielectric material layer 28 and the passsivation dielectric layer 26 to physically expose a surface of tensile metal-containing portion 24P (i.e., the topmost surface of the dual top electrode of the memory device of the present application). The opening can be formed by photolithography and etching. During the etching, the passivation layer 26 that is present on the tensile metal-containing portion 24P is removed; passivation material remains on a sidewall of the patterned material stack of the memory device pillar 20P, the compressive metal-containing portion 22P, and the tensile metal-containing portion 24P. The remaining passivation material may be referred to herein as a passivation liner 26L. The passivation liner 26L that is along the sidewall of the patterned material stack typically has a topmost surface that is coplanar with a topmost surface of the patterned material stack.

A second diffusion barrier liner 30 and a second electrically conductive structure 32 are then formed within the opening. The second diffusion barrier liner 30 and the second electrically conductive structure 32 can be formed by deposition of a diffusion barrier material layer and an electrically conductive metal or metal alloy layer, and then performing a planarization process to remove the diffusion barrier material layer and the electrically conductive metal or metal alloy layer that is present outside the opening and above the topmost surface of the second interconnect dielectric material layer 28. In some embodiments, the second diffusion barrier liner 30 is omitted.

The second diffusion barrier liner 30 may include one of the diffusion barrier materials mentioned above for first diffusion barrier liner 12. In one embodiment, the second diffusion barrier liner 30 is composed of a same diffusion barrier material as the first diffusion barrier liner 12. In another embodiment, the second diffusion barrier liner 30 is composed of a different diffusion barrier material than the first diffusion barrier liner 12. A diffusion barrier material layer that provides the second diffusion barrier liner 30 may be deposited utilizing one of the deposition processes mentioned above in forming the first diffusion barrier liner 12. The second diffusion barrier liner 30 may have a thickness within the thickness range mentioned above for the first diffusion barrier liner 12.

The second electrically conductive structure 32 may include one of the electrically conductive metals or metal alloys mentioned above for the first electrically conductive structure 14. In one embodiment, the second electrically conductive structure 32 is composed of a same electrically conductive metal or metal alloy as the first electrically conductive structure 14. In another embodiment, the second electrically conductive structure 32 is composed of a different electrically conductive metal or metal alloy than the first electrically conductive structure 14. The electrically conductive metal or metal alloy that provides the second electrically conductive structure 32 may be deposited utilizing one of the deposition processes mentioned above in forming the electrically conductive structure 14.

Figure 5:
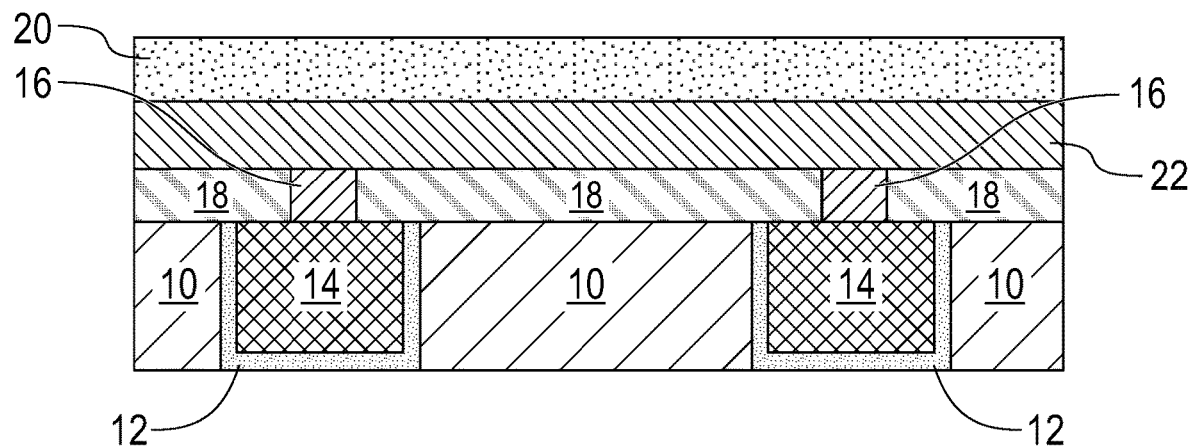
FIG. 5 is a cross sectional view of another exemplary semiconductor structure that can be employed in the present application and including a bottom electrode embedded in a dielectric capping layer and located on a surface of a first electrically conductive structure, wherein a compressive metal-containing layer and a memory device stack are located above the bottom electrode.

Referring now to FIG. 5, there is illustrated another exemplary semiconductor structure that can be employed in the present application and including a bottom electrode 16 embedded in a dielectric capping layer 18 and located on a surface of a first electrically conductive structure 14, wherein a compressive metal-containing layer 22 and a memory device stack 20 are located above the bottom electrode 16.

As is further shown, the first electrically conductive structure 14 is embedded in a first interconnect dielectric material layer 10, and an optional first diffusion barrier liner 12 is located on the sidewalls and bottom wall of the first electrically conductive structure 14. The exemplary structure of FIG. 5 is similar to the exemplary structure shown in FIG. 1A except for the location of the compressive metal-containing layer 22. In FIG. 1A, the compressive metal-containing layer 22 was located above the memory device stack, while in FIG. 5 the compressive metal-containing layer 22 is located beneath the memory device. The exemplary structure of FIG. 5 thus includes elements/components that are the same as that described above for FIG. 1A and the exemplary structure of FIG. 5 can be formed utilizing the same technique mentioned above for forming the exemplary structure of FIG. 1A.

The exemplary semiconductor structure shown in FIG. 5 has wafer bowing issues similar to that shown in FIG. 1B. Due to wafer bowing, the exemplary structure shown in FIG. 5 may exhibit poor lithography overlay during the subsequent patterning process.

Figure 6:
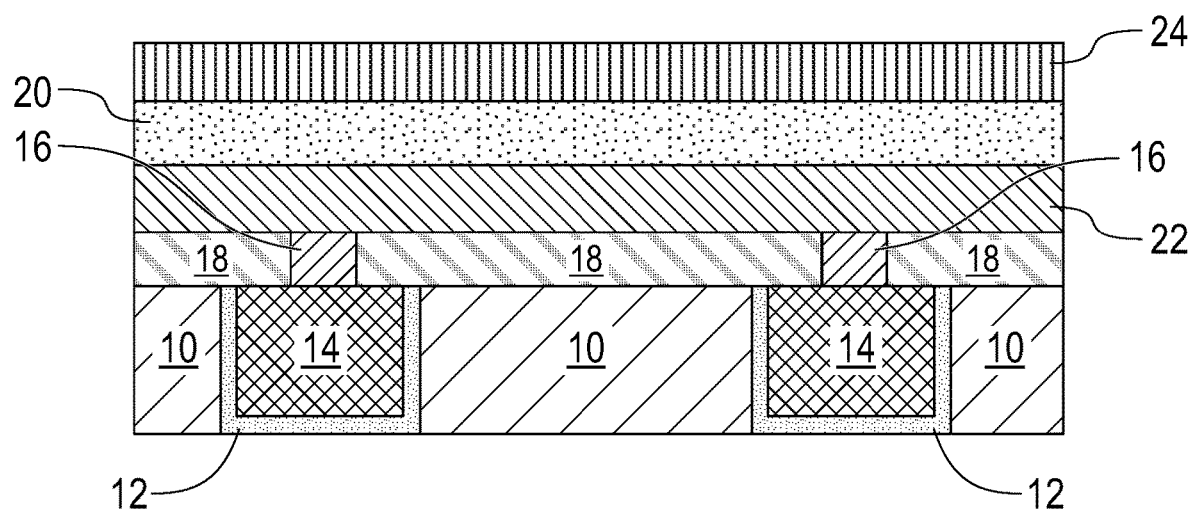
FIG. 6 is a cross sectional view of the exemplary semiconductor structure of FIG. 5 after forming a tensile metal-containing layer directly on a physically exposed surface of the memory device stack.

Referring now to FIG. 6, there is shown the exemplary semiconductor structure of FIG. 5 after forming a tensile metal-containing layer 24 directly on a physically exposed surface of the memory device stack 20. The tensile metal-containing layer 24 is the same as described in the previous embodiment of the present application. The tensile metal-containing layer 24 compensates for the compressive stress that is introduced by the compressive metal-containing layer 22. Thus, the wafer bowing is reduced, and, in some embodiments, even eliminated (see, for example, FIG. 2B).

Figure 7:
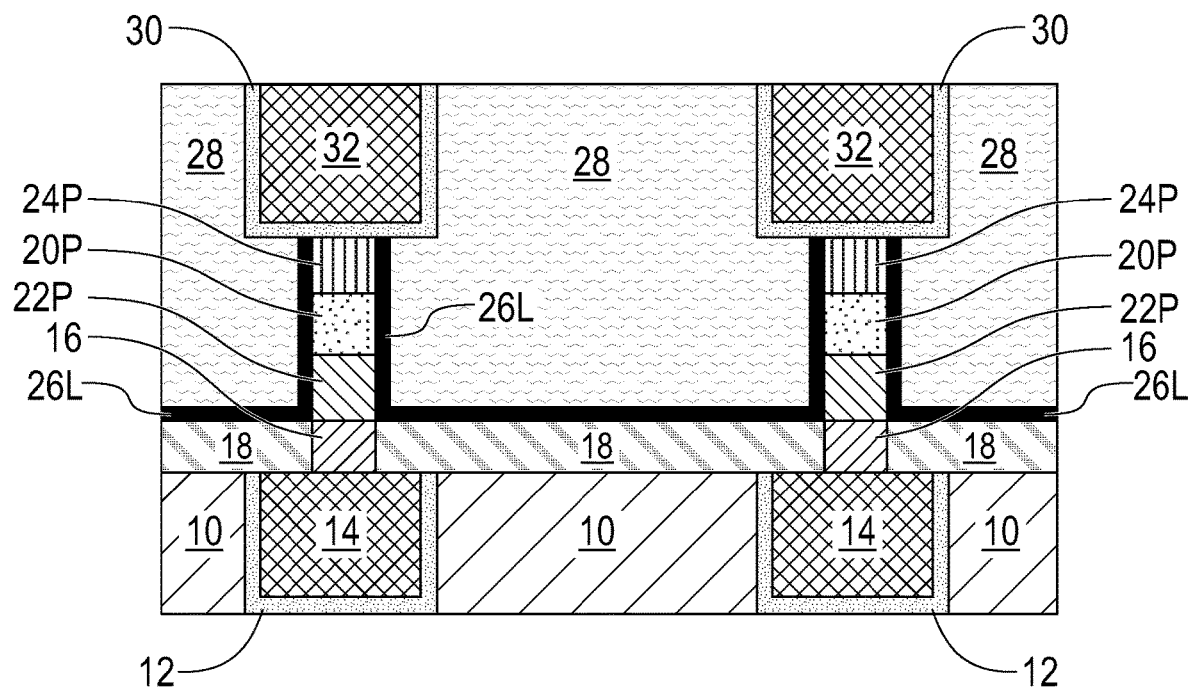
FIG. 7 is a cross sectional view of the exemplary semiconductor structure of FIG. 6 after further device processing.

Referring now to FIG. 7, there is illustrated the exemplary semiconductor structure of FIG. 6 after further device processing. The further device process includes patterning of the tensile metal-containing layer 24, the memory device stack 20 and the compressive metal-containing layer 22 to provide a patterned stack including a compressive metal-containing portion 22P, a memory device pillar 20P, and a tensile metal-containing portion 24P. In this embodiment, the tensile metal-containing portion 24P is the sole component of the top electrode, and collectively the bottom electrode 16 and the compressive metal-containing portion 22P provide a dual bottom electrode of the memory device. Patterning may be achieved by utilizing photolithography and etching as defined above in providing the patterned material stack shown in FIG. 3.

After patterning, a passivation layer, as defined above, is formed on the physically exposed surfaces of the patterned material stack and thereafter the second interconnect dielectric material layer 28 containing the second electrically conductive structure 32 is formed as described above in providing the exemplary structure shown in FIG. 4.

Figure 8:
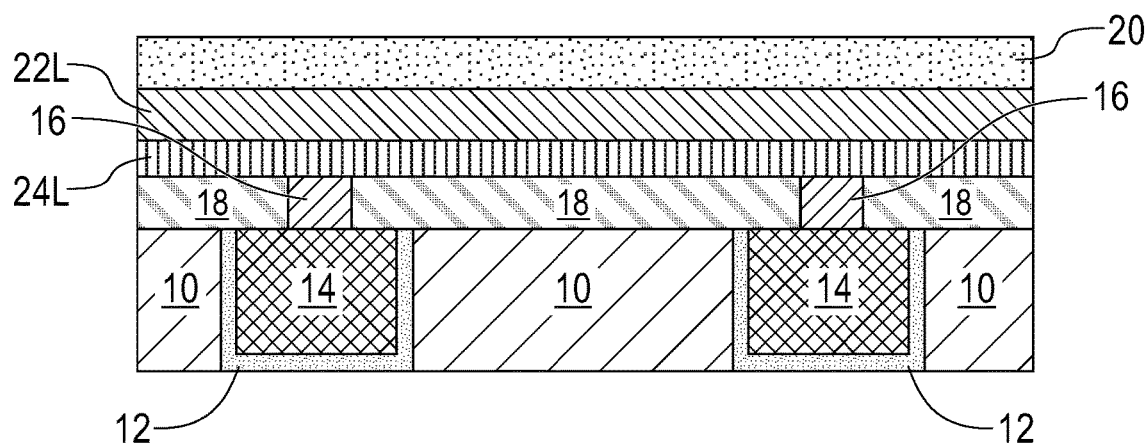
FIG. 8 is a cross sectional view of another exemplary semiconductor structure that can be employed in the present application and including a bottom electrode embedded in a dielectric capping layer and located on a surface of a first electrically conductive structure, wherein a lower tensile metal-containing layer, a lower compressive metal-containing layer and a memory device stack are located above the bottom electrode.

Referring now to FIG. 8, there is illustrated another exemplary semiconductor structure that can be employed in the present application and including a bottom electrode 16 embedded in a dielectric capping layer 18 and located on a surface of a first electrically conductive structure 14, wherein a lower tensile metal-containing layer 24L, a lower compressive metal-containing layer 22L and a memory device stack 20 are located above the bottom electrode 16.

Although this embodiment of the present application describes and illustrates a single lower tensile metal-containing layer 24L, and a single lower compressive metal-containing layer 22L, the present application works when a stack of alternating layers of a tensile metal-containing material, and a lower compressive metal-containing material are employed. The lower compressive metal-containing layer 22L serves to block a direct diffusion path to the memory device stack 20 that is provided by the lower tensile metal-containing layer 24L.

In this embodiment, the lower tensile metal-containing layer 24L, the lower compressive metal-containing layer 22L and the bottom electrode 16 will be used to form a multilayered bottom electrode of the memory device of the present application. The lower tensile metal-containing layer 24L may include one of the tensile metal-containing materials mentioned above for tensile metal-containing layer 24. The lower tensile metal-containing layer 24L may have a thickness from 5 to 20 nm. Other thicknesses are possible for the lower tensile metal-containing layer 24L.

The lower compressive metal-containing layer 22L may include one of the compressive metal-containing materials mentioned above for compressive metal-containing layer 22.

The lower compressive metal-containing layer 22L may have a thickness from 5 to 20 nm. Other thicknesses are possible for the lower compressive metal-containing layer 22L.

As is further shown, the first electrically conductive structure 14 is embedded in a first interconnect dielectric material layer 10, and an optional first diffusion barrier liner 12 is located on the sidewalls and bottom wall of the first electrically conductive structure 14. The exemplary structure of FIG. 8 can be derived from the exemplary structure shown in FIG. 1.

The exemplary semiconductor structure shown in FIG. 8 has wafer bowing issues similar to that shown in FIG. 1B. Due to wafer bowing, the exemplary structure shown in FIG. 8 may exhibit poor lithography overlay during the subsequent patterning process.

Figure 9:
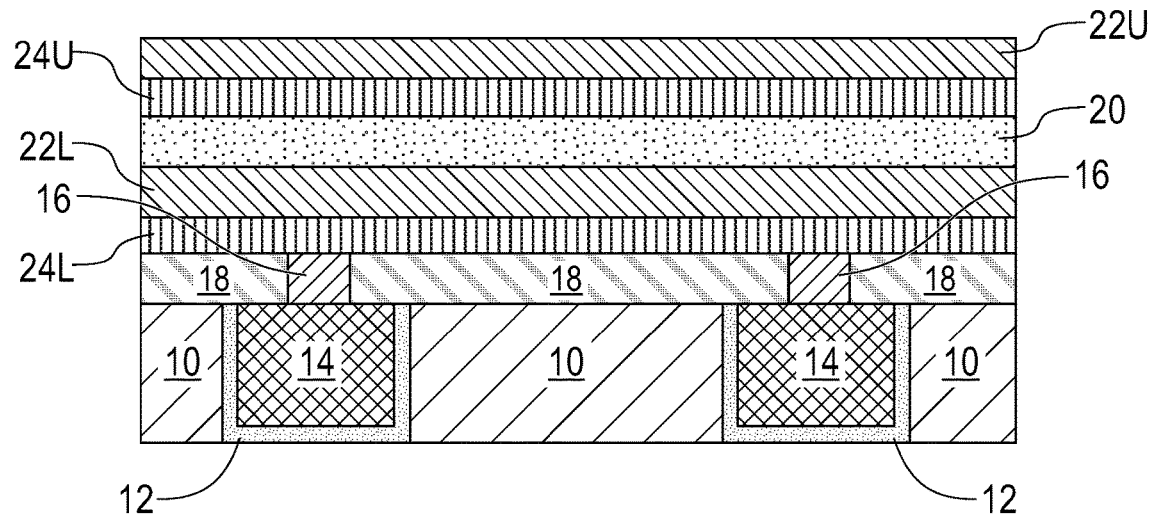
FIG. 9 is a cross sectional view of the exemplary semiconductor structure of FIG. 8 after forming an upper tensile metal-containing layer and an upper compressive metal-containing layer above the memory device stack.

Referring now to FIG. 9, there is illustrated the exemplary semiconductor structure of FIG. 8 after forming an upper tensile metal-containing layer 24U and an upper compressive metal-containing layer 22U above the memory device stack 20. Although this embodiment of the present application describes and illustrates a single upper tensile metal-containing layer 24U, and a single upper compressive metal-containing layer 22U, the present application works when a stack of alternating layers of a tensile metal-containing material, and a lower compressive metal-containing material are employed.

In this embodiment, the upper tensile metal-containing layer 24U, and the upper compressive metal-containing layer 22U will provide a multilayered top electrode of the memory device of the present application.

The upper tensile metal-containing layer 24U may include one of the tensile metal-containing materials mentioned above for tensile metal-containing layer 24. The upper tensile metal-containing layer 24U may have a thickness from 5 to 20 nm. Other thicknesses are possible for the upper tensile metal-containing layer 24U. The upper compressive metal-containing layer 22U may include one of the compressive metal-containing materials mentioned above for compressive metal-containing layer 22. The upper compressive metal-containing layer 22U may have a thickness from 5 to 20 nm. Other thicknesses are possible for the upper compressive metal-containing layer 22U.

Figure 10:
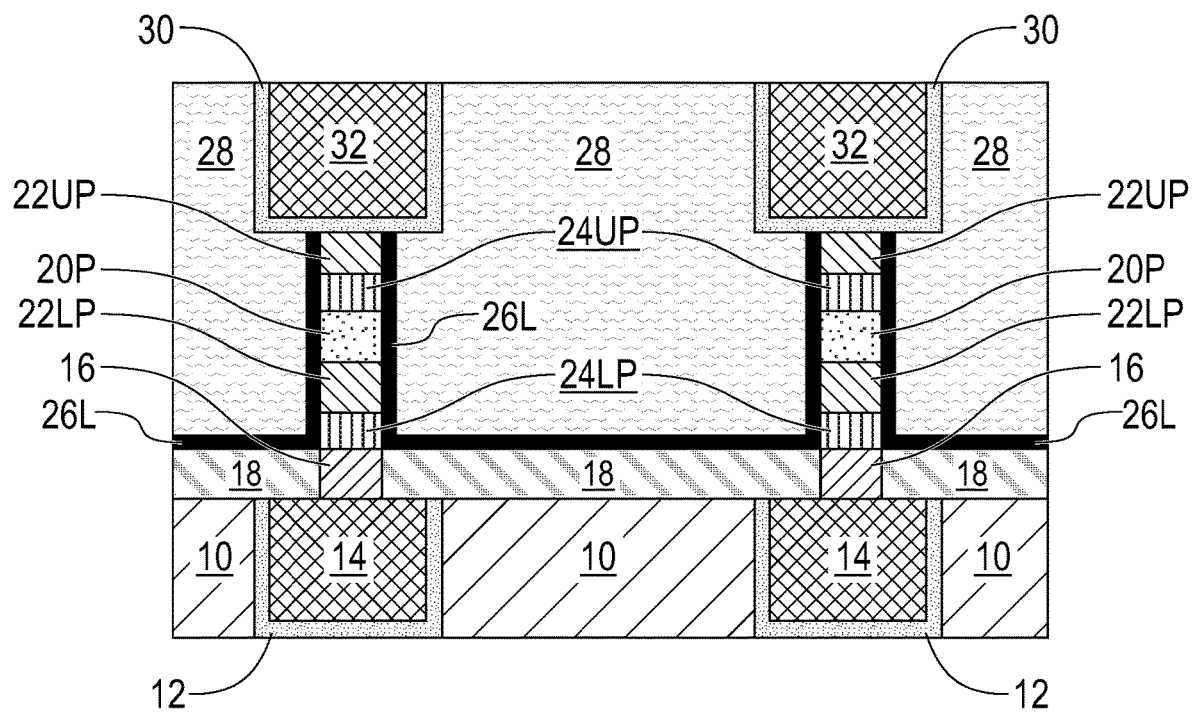
FIG. 10 is a cross sectional view of the exemplary semiconductor structure of FIG. 9 after further device processing.

Referring now to FIG. 10, there is illustrated the exemplary semiconductor structure of FIG. 9 after further device processing. The further device process includes patterning of the upper compressive metal-containing layer 22U, the upper tensile metallic layer 24U, the memory device stack 20, the lower compressive metal-containing layer 22L and the lower tensile metal-containing layer 24L to provide a patterned stack, of from bottom to top, a lower tensile metal-containing portion 24LP, a lower compressive metal-containing portion 22LP, a memory device pillar 20P, an upper tensile metal-containing portion 24UP, and an upper compressive metal-containing portion 22U. In this embodiment, the upper tensile metal-containing portion 24UP, and the upper compressive metal-containing portion 22UP provide a top electrode of the memory device of the present application. The patterning may be achieved by photolithography and etching as defined above in providing the patterned material stack shown in FIG. 3.

After patterning, a passivation layer, as defined above is formed on the physically exposed surfaces of the patterned material stack and thereafter the second interconnect dielectric material layer 28 containing the second electrically conductive structure 32 is formed as described above in providing the exemplary structure shown in FIG. 4.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a bottom electrode located on a surface of a first electrically conductive structure, wherein the first electrically conductive structure is embedded in a first interconnect dielectric material layer;
   a memory device pillar located on a surface of the bottom electrode, wherein the memory device pillar is a ferroelectric memory (FE) device pillar, a resistive random access memory (ReRAM) device pillar, a magnetoresistive random access memory (MRAM) device pillar, or a phase change random access memory (PRAM) device pillar; and
   a top electrode located on the memory device pillar, wherein the top electrode includes a compressive metal-containing portion in direct physical contact with the memory device pillar, and a tensile metal-containing portion located directly on the compressive metal-containing portion.

2. The semiconductor structure of claim 1, wherein the tensile metal-containing portion compensates the compressive stress caused by the compressive metal-containing portion.

3. The semiconductor structure of claim 1, further comprising a second interconnect dielectric material layer located laterally adjacent to, and above, the memory device pillar and the top electrode, wherein a second electrically conductive structure is present in the second interconnect dielectric material layer and contacts a surface of the top electrode.

4. The semiconductor structure of claim 1, wherein the bottom electrode is embedded in a dielectric capping layer.

5. The semiconductor structure of claim 1, further comprising a passivation liner located on a sidewall of the memory device pillar and the top electrode.

6. The semiconductor structure of claim 1, wherein the compressive metal-containing portion is composed of tantalum nitride, and the tensile metal-containing portion is composed of titanium nitride.

7. A semiconductor structure comprising:
   a bottom electrode located on a surface of a first electrically conductive structure, wherein the first electrically conductive structure is embedded in a first interconnect dielectric material layer;
   a first compressive metal-containing portion located above the bottom electrode;
   a memory device pillar located on a surface of the first compressive metal-containing portion, wherein the memory device pillar is a ferroelectric memory (FE) device pillar, a resistive random access memory (ReRAM) device pillar, a magnetoresistive random access memory (MRAM) device pillar, or a phase change random access memory (PRAM) device pillar; and
   a top electrode composed of a first tensile metal-containing portion located on the memory device pillar.

8. The semiconductor structure of claim 7, further comprising a second tensile metal-containing portion located between the bottom electrode and the first compressive metal-containing portion, and a second compressive metal-containing portion located on a topmost surface of the first tensile metal-containing portion.

9. The semiconductor structure of claim 8, wherein the first and second tensile metal-containing portions compensate the compressive stress caused by the first and second compressive metal-containing portions.

10. The semiconductor structure of claim 7, further comprising a second interconnect dielectric material layer located laterally adjacent to, and above, the memory device pillar and the top electrode, wherein a second electrically conductive structure is present in the second interconnect dielectric material layer and contacts a surface of the top electrode.

11. The semiconductor structure of claim 7, wherein the bottom electrode is embedded in a dielectric capping layer.

12. The semiconductor structure of claim 7, further comprising a passsivation liner located on a sidewall of the memory device pillar and the top electrode.

13. A method of reducing wafer bowing in a semiconductor structure, the method comprising:
    forming a bottom electrode located on a surface of a first electrically conductive structure, wherein the first electrically conductive structure is embedded in a first interconnect dielectric material layer;
    forming a memory device stack above the bottom electrode and on a topmost surface of the first interconnect dielectric material layer, wherein a first compressive metal-containing layer contacts one surface of the memory device stack and the memory device stack is a ferroelectric memory (FE) device stack, a resistive random access memory (ReRAM) device stack, a magnetoresistive random access memory (MRAM) device stack, or a phase change random access memory (PRAM) device stack; and
    forming a first tensile metal-containing layer above the memory device stack, wherein the first tensile metal-containing layer compensates the compressive stress caused by the first compressive metal-containing layer.

14. The method of claim 13, wherein the one surface of the memory device stack is the bottommost surface, and the first tensile metal-containing layer directly contacts a topmost surface of the memory device stack.

15. The method of claim 13, wherein the one surface of the memory device stack is the bottommost surface, and wherein a second tensile metal-containing layer is located between the first compressive metal-containing layer and the bottom electrode, and wherein the first tensile metal-containing layer is spaced apart from a topmost surface of the memory device stack by a second compressive metal-containing layer.

16. The method of claim 13, wherein the one surface of the memory device stack is a topmost surface, and the first tensile metal-containing layer is located directly on a topmost surface of the first compressive metal-containing layer.

17. The method of claim 13, further comprising:
    patterning the memory device stack, the first compressive metal-containing layer, and the first tensile metal-containing layer to provide a patterned stack of the memory device stack, the first compressive metal-containing layer, and the first tensile metal-containing layer;
    forming a passivation layer on physically exposed surfaces of the patterned stack; and
    forming a second electrically conductive structure containing a topmost surface of patterned stack, wherein the second electrically conductive structure is embedded in a second interconnect dielectric material layer.

* * * * *